(12) United States Patent
Wedel

(10) Patent No.: US 6,933,785 B2
(45) Date of Patent: Aug. 23, 2005

(54) COMMON MODE BIAS CONTROL LOOP FOR OUTPUT STAGES

(75) Inventor: Dale S. Wedel, Loveland, CO (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/447,629

(22) Filed: May 28, 2003

(65) Prior Publication Data

US 2004/0239427 A1 Dec. 2, 2004

(51) Int. Cl.[7] ............................................... H03F 3/26
(52) U.S. Cl. ....................................... 330/265; 330/290
(58) Field of Search ................................. 330/265, 267, 330/288, 290; 323/315, 316

(56) References Cited

U.S. PATENT DOCUMENTS

| | | | |
|---|---|---|---|
| 4,145,666 A * | 3/1979 | Seki | ............................. 330/265 |
| 4,335,358 A | 6/1982 | Hoeft | |
| 5,162,751 A | 11/1992 | Blanken et al. | |
| 5,440,273 A | 8/1995 | Gusinov et al. | |
| 5,521,553 A | 5/1996 | Butler | |
| 5,734,296 A | 3/1998 | Dotson et al. | |
| 5,786,731 A | 7/1998 | Bales | |
| 6,104,244 A | 8/2000 | Gilbert | |
| 6,262,633 B1 | 7/2001 | Close | |
| 6,535,064 B2 * | 3/2003 | Harvey | ........................ 330/265 |
| 6,566,958 B1 | 5/2003 | Smith | |
| 6,741,133 B2 * | 5/2004 | Kinsho et al. | ............... 330/263 |

* cited by examiner

Primary Examiner—Henry Choe
(74) Attorney, Agent, or Firm—Sidley Austin Brown Wood LLP

(57) ABSTRACT

An output circuit is described, which includes a gain stage, n and p drives, coupled to the gain stage, a mean current generator, coupled to the drives, a reference current generator, coupled to the mean current generator, and feedback circuitry, coupled between the gain stage and the mean current generator. In this circuitry the feedback, provided by the feedback circuitry to the mean current generator, is a current mode feedback. The mean current generator generates the harmonic mean of currents, provided through current nodes. The described output circuit can be operated by providing currents at the current nodes of the mean current generator, generating a mean of provided currents with the mean current generator, and providing a current mode feedback by the feedback circuitry to the mean current generator. The feedback circuitry computes the difference between the generated mean current and a reference current.

30 Claims, 8 Drawing Sheets

FIG. 2B Common Source Amplifier 39

FIG. 2A Common Emitter Amplifier 36

COMMON MODE BIAS CONTROL LOOP FOR OUTPUT STAGES

BACKGROUND

1. Field of Invention

The present invention relates to output stages, and more particularly to common mode control loops for output stages.

2. Description of Related Art

The present invention relates generally to low power equipment such as modem telecommunications systems, cell phones, displays, and simple battery powered devices. Electronic equipment typically contains operational amplifiers, for which low power consumption and good dynamic performance are important design considerations. These designs goals require efficient techniques for bias control.

Supply voltages in electronic equipment are continually decreasing. Even high-speed components in common signal chains are required to use the lowest practical voltage to minimize power consumption. However, modem standards for video and high-accuracy data-acquisition systems require large signal swing capabilities to optimize dynamic performance, including voltage swings of 2V or greater. This makes it important for analog circuitry to make use of increasing portions of the supply voltage range. Examples of such analog circuitry include rail-to-rail gain stages, in which the output voltages can swing almost from the voltage of one supply rail to the voltage of the other. Such an operation of a gain stage is referred to as "rail-to-rail" operation. Rail-to-rail amplifiers often use a class AB architecture, sometimes referred to as push-pull architecture.

A problem with building amplifiers with rail-to-rail gain stages, however, is that they tend to be more complex than traditional amplifiers, thus requiring a high number of circuit elements.

In U.S. Pat. No. 5,162,751, entitled "Amplifier Arrangement", to Blanken and Thus, hereby incorporated by reference in its entirety, a low voltage class AB amplifier arrangement is described. Aspects of this amplifier design include a class AB gain stage, in which the signal and the bias current control share the same path. In such amplifiers the dynamic performance of the signal path is the same as the bias current control path, and vice versa. This directly couples the effects of one to the other, limiting the optimization of the design for good dynamic response of the signal. Furthermore, the feedback circuitry of the described design operates in a voltage mode, whereby modular design changes, for example changing Bipolar to CMOS output transistors, is difficult to achieve. Finally, the problems addressed by this design include operating at low voltages, such as at 1.2V, possibly at lower frequencies, such as 1 MHz.

U.S. Pat. Nos. 5,521,553, 5,440,273, 5,786,731, 5,162,751, 4,335,358, and 5,734,296, all hereby incorporated by reference in their entirety, describe a variety of related efforts for improved performance of gain stages and amplifier circuitry. Yet there still remains room for improvement concerning minimizing complexity, reducing component count, achieving stable operation, and improving dynamic performance.

SUMMARY

Briefly and generally, an output circuit is described, which includes a gain stage, an n drive and a p drive, coupled to the gain stage, a mean current generator, coupled to the drives, a reference current generator, coupled to the mean current generator, and feedback circuitry, coupled between the gain stage and the mean current generator. In this circuitry the feedback, provided by the feedback circuitry to the mean current generator, is a current mode feedback. Embodiments include mean current generators that generate the harmonic mean of currents, provided through current nodes.

The described output circuit can be operated by providing currents at the current nodes of the mean current generator, generating a mean of provided currents with the mean current generator, and providing a current mode feedback by the feedback circuitry to the mean current generator. Here providing a current can be drawing a current or supplying a current through the current nodes.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention and their advantages are best understood by referring to FIGS. 1–8 of the drawings. Like numerals are used for like and corresponding parts of the various drawings.

Figure 1:
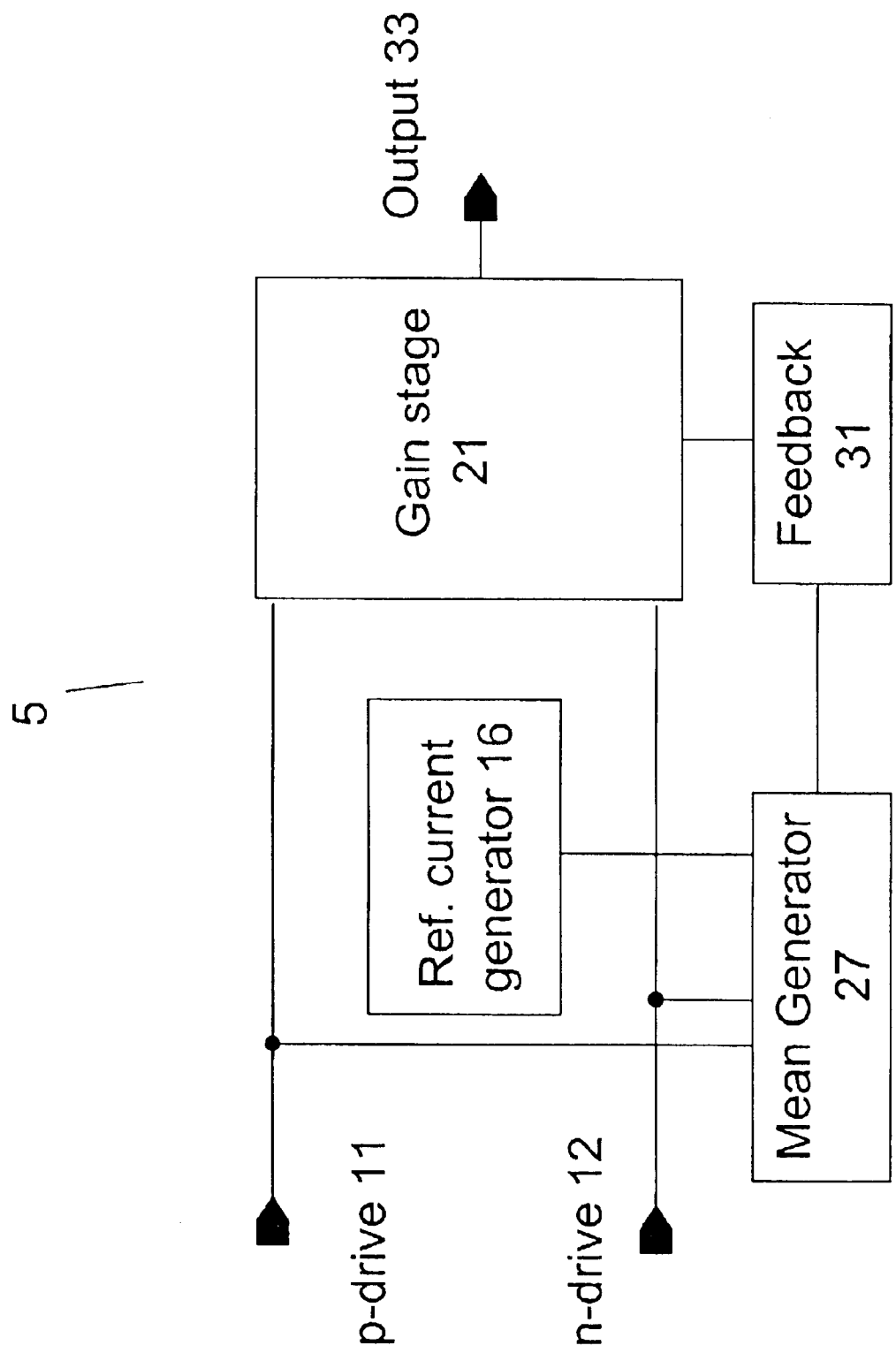
FIG. 1 is a block diagram of a Common Mode Controlled Amplifier, according to an embodiment of the invention.
Figure 2:
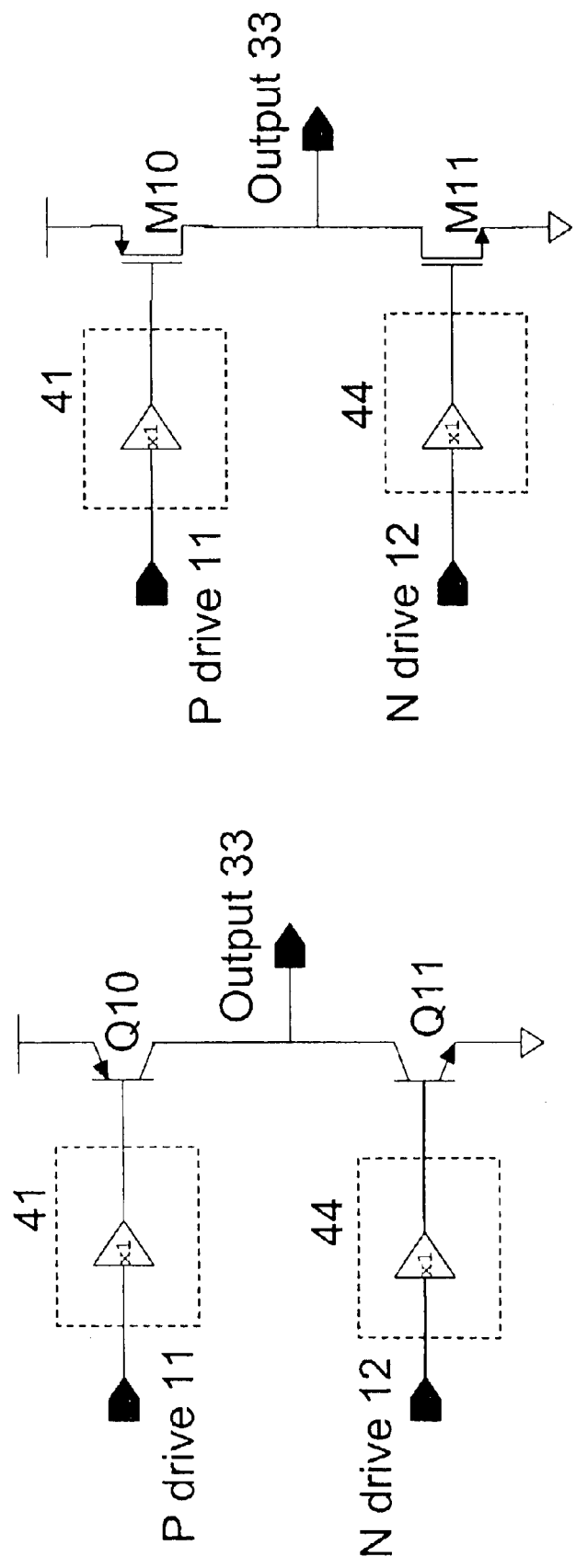
FIG. 2A is a schematic implementation of a Common Emitter Amplifier, according to an embodiment of the invention.
FIG. 2B is a schematic implementation of a Common Source Amplifier, according to an embodiment of the invention.

FIG. 1 is a block diagram of a Common Mode Controlled Amplifier 5, according to an embodiment of the invention. A p-drive 11 and an n-drive 12 are coupled to a gain stage 21. Gain stage 21 outputs the output signal at output terminal 33. A mean current generator 27 is coupled to p-drive 11 and to n-drive 12. A reference current generator 16 is coupled to mean current generator 27. A feedback circuit 31 is coupled between gain stage 21 and mean current generator 27.

Feedback circuit 31 provides feedback signals to mean current generator 27 in relation to the output current. In embodiments of the invention the feedback signals are in the current mode. Mean current generator 27 computes a mean current from the feedback currents. The mean current is compared to a reference current, provided by reference current generator 16. The difference of the mean current and the reference current is used to level shift the drive signals, thereby setting the quiescent points of the transistors of gain stage 21. In some embodiments the mean is a harmonic mean, in other embodiments the mean is a geometric mean.

In some embodiments reference current generator 16 is coupled between p-drive 11 and n-drive 12. Some embodiments have only a single drive node. The single drive node is coupled to gain stage 21. In these embodiments there is no separate differential signal and common mode signal.

FIGS. 2A–B illustrates embodiments of output stage 21. In FIG. 2A output stage 21 is a common emitter amplifier 36. P-drive 11 is coupled into p-buffer 41. P-buffer 41 provides an additional beta factor, thereby increasing the apparent impedance of the output transistors. Here the beta factor is the ratio of the collector current to the base current. P-buffer 41 drives the base of output transistor Q10.

N-drive 12 is coupled into n-buffer 44, which drives the base of output transistor Q11. The collectors of transistors Q10 and Q11 drive output terminal 33. This architecture is sometimes referred to as class AB, or push-pull architecture, as the two output transistors work in tandem. By way of example, when the collector current of Q10 (proportional to Ip) is increased by the p-signal, the corresponding n-signal decreases the collector current of Q11 (proportional to In). In this embodiment output transistors Q10 and Q11 are bipolar transistors, Q10 being pnp type, Q11 being npn type. In some embodiments the types of the output transistors are reversed. In embodiments of output stage 21 output transistors Q10 and Q11 are of complimentary types, vertically ordered in accordance with their type, as shown in FIGS. 2A–2B.

In FIG. 2B output stage 21 is a common source amplifier 39. P-drive 11 is coupled into p-buffer 41. P-buffer 41 provides an increase of the apparent impedance of the output transistors. P-buffer 41 drives the gate of output field effect transistor M10.

N-drive 12 is coupled into n-buffer 44, which drives the gate of output field effect transistor M11. The drains of field effect transistors M10 and M11 drive output terminal 33. This architecture is sometimes referred to as class AB, or push-pull architecture, as the two output transistors work in tandem. When the source current of M10 (proportional to Ip) is increased by the p-signal, the corresponding n-signal decreases the source current of M11 (proportional to In). In this embodiment output transistors Q10 and Q11 are CMOS transistors.

Figure 3:
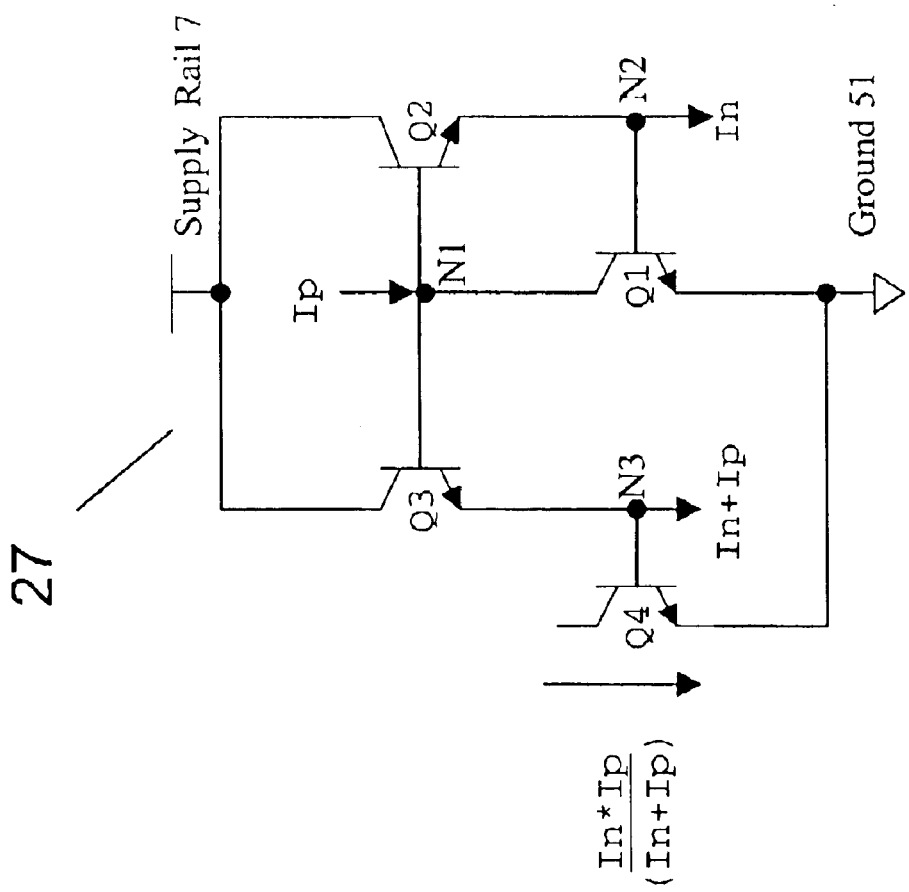
FIG. 3 is an exemplary implementation of a harmonic mean current generator according to an embodiment of the invention.

FIG. 3 illustrates the operating principle of an embodiment of mean current generator 27. The present embodiment has four transistors, Q1, Q2, Q3, and Q4. In this embodiment the four transistors Q1–Q4 are all of the same type, for example bipolar npn transistors. Furthermore, Q1–Q4 have substantially same parameters, such as saturation current Is and beta factor. However, in other embodiments transistors can have different parameters. The collectors of transistors Q2 and Q3 are coupled to a supply rail 7. The emitter of transistor Q2 is coupled to an input node N2. The emitter of transistor Q3 is coupled to an input node N3. The bases of Q2 and Q3 are coupled to an input node N1. The collector of transistor Q1 is also coupled to input node N1. The emitter of transistor Q1 is coupled to ground 51. The base of transistor Q1 is coupled to input node N2. The emitter of transistor Q4 is coupled to ground 51. The base of transistor Q4 is coupled to input node N3. Throughout this application the term "coupled" includes embodiments, where the transistors are directly coupled, as well as embodiments, where the transistors are coupled through suitably chosen resistors.

The operation of the present embodiment can be understood from the following remarks. In the subsequent remarks the effect of base currents will be neglected. In related embodiments additional circuit elements are included to compensate for the effects of the base currents.

The supply rail provides a voltage Vcc. A current Ip is sourced into input node N1, generating a collector current Ip through transistor Q1. A current In is sunk from input node N2, generating a collector current In through transistor Q2. A current Ip+In is sunk from input node N3, generating a collector current Ip+In through transistor Q3. The derivation below shows that in the present embodiment a collector current $$Iq=(In*Ip)/(In+Ip)$$

flows through transistor Q4. This particular combination is sometimes referred to as the "harmonic mean" of In and Ip. It can also be cast into the form:

$$1/Iq=1/In+1/Ip$$

Using Kirchhoff's laws to express the voltage of input node N1 in two different ways one obtains:

$$Vbe1+Vbe2=Vbe3+Vbe4.$$

Here Vbe is the base-emitter voltage of transistor Qn. For example, Vbe2 is the base-emitter voltage of transistor Q2. The above equation can be rewritten as:

$$Vbe1-Vbe3=Vbe4-Vbe2$$

Using the Ebers-Moll equation one obtains:

$$VT\ ln(Ic1/Is1)-VT\ ln(Ic3/Is3)=VT\ ln(Ic4/Is4)-VT\ ln(Ic2/Is2).$$

Here VT is the thermal voltage $$VT=kT/q,$$

where k is Boltzmann's constant, T is the temperature in degrees of Kelvin, and q is the charge of the electron. Furthermore, Icn is the collector current of transistor Qn, and Isn is the saturation current of transistor Qn. For transistors with the same parameters, Is1=Is2=Is3=Is4, approximately. Using the mathematical relation: lnx−lny= ln(x/y), and simplifying the above equation one obtains:

$$Ic1/Ic3=Ic4/Ic2,$$

or equivalently, $$Ic1*Ic2=Ic3*Ic4$$

Now recalling that Ic1=Ip, Ic2=In, and Ic3=Ip+In, one gets for Ic4=Iq:

$$Iq=In*Ip/(In+Ip),$$

the harmonic mean, as described above.

Figure 4:
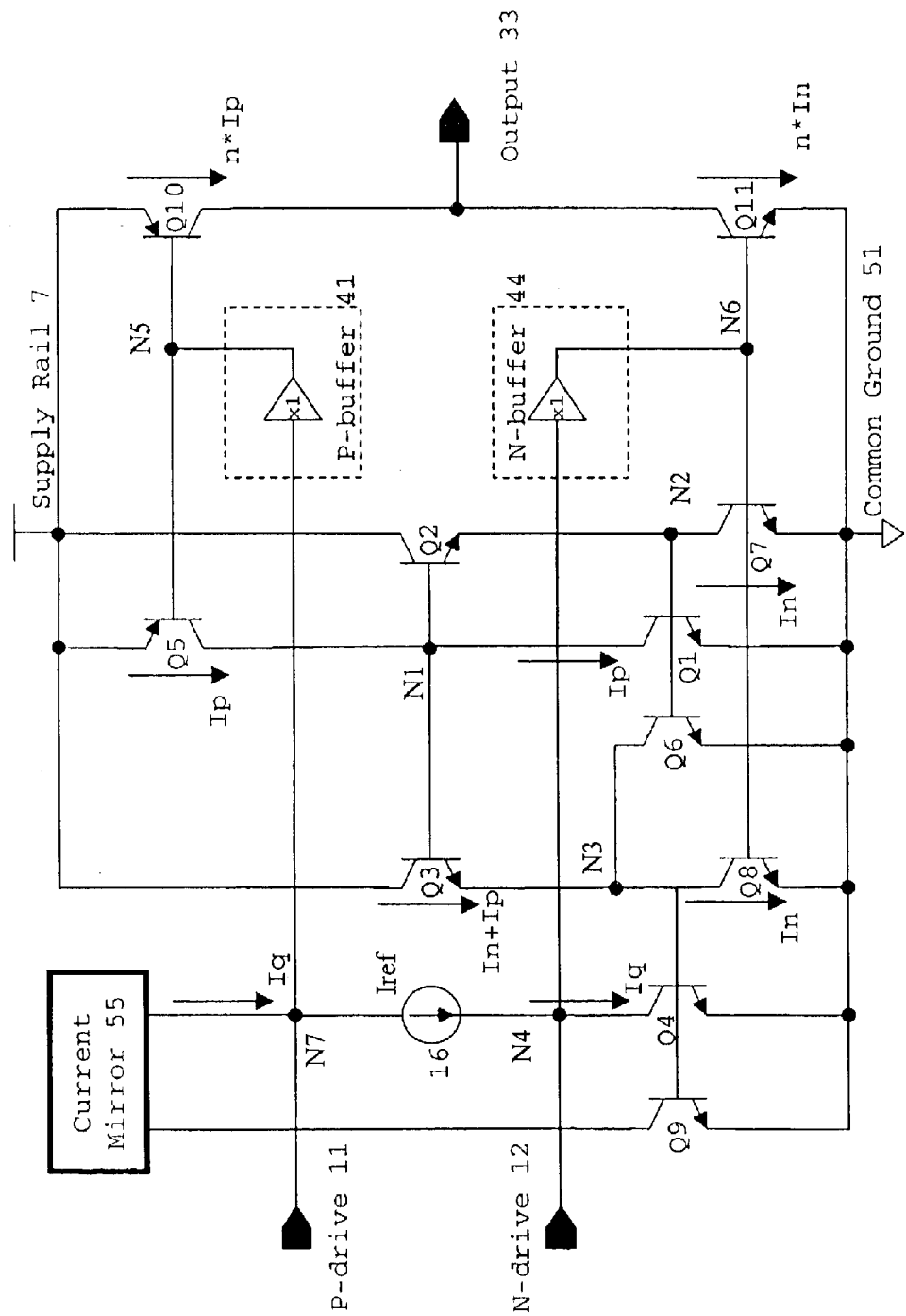
FIG. 4 is an exemplary implementation of a Common Mode Controlled Amplifier according to an embodiment of the invention.

FIG. 4 illustrates an embodiment, where the various functional units of FIG. 3 are shown in more detail. Similarly labeled transistors play similar functions in the different Figures. Transistors Q1–Q11 are npn type, with the exception of Q5 and Q10, which are pnp type. Other embodiments have the types of the transistors reversed.

Output transistors Q10 and Q11 are of complimentary types, e.g. Q10 of the pnp type and Q11 of the npn type.

In this embodiment mean current generator 27 includes transistors Q1–Q4, feedback circuit 31 includes transistors Q5–Q9, finally output stage 21 includes transistors Q10–Q11. Mean current generator 27 constitutes a translinear loop 56, which is biased by the current mode feedback of feedback circuit 31.

In FIG. 4 the collector of transistor Q1 is coupled to input node N1. The emitter of Q1 is coupled to common ground 51. The base of Q1 is coupled to input node N2. The collectors of transistors Q2 and Q3 are coupled to supply rail 7. The bases of Q2 and Q3 are coupled to input node N1. The emitter of Q2 is coupled to input node N2. The emitter of Q3 is coupled to input node N3.

The collector of transistor Q4 is coupled to node N4. The base of Q4 is coupled node N3. The emitter of Q4 is coupled to ground 51. The emitter of pnp type transistor Q5 is coupled to supply rail 7, the base of Q5 is coupled to node N5, and the collector of Q5 is coupled to input node N1. The collector of transistor Q6 is coupled to node N3, the base of Q6 is coupled to the base of Q1, and the emitter of Q6 is coupled to ground 51. The collector of transistor Q7 is coupled to node N2, the base of Q7 is coupled to node N6, and the emitter of Q7 is coupled to ground 51. The collector of transistor Q8 is coupled to input node N3, the base of Q8 is coupled to the base of Q7, and the emitter of Q8 is coupled to ground 51. The collector of transistor Q9 is coupled to current mirror 55, the base of Q9 is coupled to the base of Q4, and the emitter of Q9 is coupled to ground 51. The emitter of pnp type output transistor Q10 is coupled to supply rail 7, the base of Q10 is coupled to node N5, and the collector of Q1 is coupled to output terminal 33. The collector of output transistor Q11 is coupled to output terminal 33. The base of Q11 is coupled to node N6, the emitter of Q11 is coupled to ground 51.

The architecture of the embodiment in FIG. 4 is symmetric for the p-signal, received through p-drive 11, and the n-signal, received through n-drive 12. Symmetric architectures typically have favorable dynamic performance, for example, the leading and trailing edges of impulses are symmetric, thus reducing a possible source of dynamic distortions and harmonic distortions.

P-drive 11 is coupled to node N7 and n-drive 12 is coupled to node N4. Reference current source 16 is coupled between nodes N7 and N4. P-buffer 41 is coupled between nodes N5 and N7, and n-buffer 44 is coupled between nodes N4 and N6.

The operation of the described circuit can be illustrated from the following remarks. Transistor Q5 serves as a current source, sourcing a current Ip into input node N1, thus generating a collector current Ip through transistor Q1. Transistor Q7 serves as a current source, sinking a current In from input node N2, thus generating a collector current In through transistor Q2.

Since the bases of transistors Q1 and Q6 are coupled and both transistors are grounded, their base-emitter voltages are substantially the same: Vbe1=Vbe6. Since Q1 and Q6 are substantially similar, the collector current of Q6 is substantially the same as the collector current of Q1, which is Ip. Since the bases of Q7 and Q8 are coupled and both transistors are grounded, their base-emitter voltages are substantially the same: Vbe7=Vbe8. Since Q7 and Q8 are substantially similar, the collector current of Q8 is substantially the same as the collector current of Q7, which is In. Therefore, by applying Kirchhoff's law to input node N3, the total current sunk from input node N3 is Ip+In, generating a collector current (Ip+In) through Q3.

The above remarks illustrate that mean current generator 27, which includes transistors Q1–Q4, has a current Ip sourced into input node N1, a current In sunk from input node N2, and a current (Ip+In) sunk from input node N3. As described in relation to FIG. 3, therefore a current Iq=In*Ip/(In+Ip) will flow through the collector of transistor Q4. For this reason, in the present embodiment the harmonic mean of currents In and Ip is generated in Q4 by mean current generator 27.

Mean current generator 27 and feedback circuit 31 are coupled to output stage 21. The base-emitter voltage of pnp transistor Q5 is the same as the base-emitter voltage of pnp output transistor Q10: Vbe5=Vbe10. Q10 is manufactured so that the junction area of Q10 is n times bigger than the junction area of Q5. Therefore, the same base-emitter voltage generates a collector current in Q10, which is n times bigger than the collector current of Q5: Ic10=n*Ip. In embodiments the value of n varies between about 1 to about a hundred, for example between about 10 to about 15.

Similarly, the junction area of npn output transistor Q11 is n times bigger than the junction area of transistor Q7, and the base-emitter voltages of these two transistors are the same as well. Therefore, Ic11=n*In.

As mean current generator 27 forces a harmonic mean relationship between Ip and In, a similar relationship will hold between the output currents:

$$1/(n*In)+1/(n*Ip)=1/(n*Iq).$$

Finally, by applying Kirchhoff's law at output terminal 33, the output current is determined as:

$$Iout=n*Ip-n*In.$$

The output voltage at output terminal 33 is controlled by an external feedback circuitry. Examples of this external feedback circuitry are well known in the art and will not be described in detail.

The output voltage can swing close to the supply voltage. The collector voltage of output transistor Q10 can swing as high as a diode drop, or approximately 0.6V below the voltage of supply rail 7 in non-saturated operations. When Q10 is saturated, then the collector voltage can swing even higher, for example only 0.2 V below the voltage of supply rail 7. Similarly, the collector voltage of output transistor Q11 can swing within 0.2V of ground in saturated operations. Amplifiers with such large voltage swing are sometimes referred to as "rail-to-rail" amplifiers.

Without a signal in p-drive 11 and n-drive 12, reference current generator 16 forces Iq to be equal to reference current Iref: Iq=Iref. Furthermore, the voltage of node N4 equals the voltage of node N6: VN4=VN6, and the voltage of node N5 equals the voltage of node N7: VN5=VN7. Reference current generator 16 adjusts the voltages VN5 and VN6 by adjusting VN7 and VN4, respectively, so that the base-emitter voltage Vbe7 of Q7 is consistent with a collector current of Ic7=In, and the base-emitter voltage Vbe5 of Q5 is consistent with a collector current of Ic5=Ip. Correspondingly, a current n*Ip will flow in Q10 and a current n*In in Q11.

In sum, mean current generator 27, controlled by feedback loop 31, controls the quiescent currents of output transistors Q10 and Q11.

Since Iref is a non-zero value, the harmonic mean relationship forces both In and Ip to assume finite values. Once signals are applied through p-drive 11 and n-drive 12, the values of In and Ip will vary according to the signals. However, the harmonic mean relationship between In and Ip will be preserved, and In and Ip remain finite.

Some amplifier circuits, which have similar push-pull architecture, but different control circuits, allow In or Ip to be driven to near zero values by the drive signals. For example, there are amplifiers, where In and Ip are connected through a geometric mean relationship:

$Iq=(In*Ip)^{1/2}$.

These amplifiers allow In or Ip to assume near zero values. If, for example, In is driven to near zero, then the corresponding output transistor (Q11 in FIG. 4) substantially shuts down. As the driving signal varies in time, it will require In to assume finite values again. This, in turn requires that the corresponding transistor (Q11) recovers from a shut down state into a conducting state. Most transistors require a relatively long time to recover from their shut down state. This long recovery time distorts the dynamic performance of the output stage.

In contrast, since mean current generator 27 forces a harmonic mean relationship between In and Ip, neither In nor Ip can assume values smaller than Iq, as can be seen from the defining equation of the harmonic mean. Therefore, the present embodiment, avoids dynamic distortions of the output stage, which would result from slow recovery of shut down transistors.

The harmonic relationship between In and Ip holds only approximately, as the circuit analysis neglected base currents. The output transistors Q10 and Q11 are typically bigger than the transistors Q1–Q9 of mean current generator 27 and feedback loop 31. Therefore, the base currents of Q10 and Q11 are bigger as well, potentially seriously modifying the harmonic relationship between In and Ip. The buffers 41 and 44 are capable of preventing the large base currents of the output transistors to disadvantageously influence the currents of mean current generator 27 and feedback loop 31.

The small signal behavior of the circuit can be illustrated by the following remarks.

Typically a signal has a differential component and a common mode component. As demonstrated above, the output current of Common Mode Controlled Amplifier 5 is Iout=n*Ip−n*In, i.e. Iout is proportional to the difference of Ip and In. As described above, the voltage of p-drive 11 controls Ip and the voltage of n-drive 12 controls In.

Raising the p-drive voltage raises the voltage of the base of Q10 through nodes N7 and N5, thereby lowering the Vbe10 base-emitter voltage of output transistor Q10, in effect suppressing the collector current of Q10, n*Ip. At the same time, raising the n-drive voltage raises the voltage of the base of Q11 through nodes N4 and N6, thereby increasing the Vbe11 base-emitter voltage of output transistor Q11, in effect increasing the collector current of Q11, n*In. In sum, Ip is reduced, In is enhanced. For this reason, for the purposes of the present application, raising the voltages of p-drive 11 and n-drive 12 simultaneously will be referred to as "differential signal". On the other hand, varying the signals of p-drive 11 and n-drive 12 in an opposing, symmetrical way will be referred to as "common mode signal".

In biasing schemes, where Common Mode Controlled Amplifier 5 is used to source current at output terminal 33, Ip is chosen to be greater than In. In such embodiments, output current Iout=(n*IP−n*In) is decreases, when the "differential signal" is raised. In a completely analogous manner, when the "differential signal" is decreased, output current Iout=(n*Ip−n*In) increases.

The "common mode" of Common Mode Controlled Amplifier 5 includes raising the voltage of one drive and lowering the voltage of the other drive. Common Mode Controlled Amplifier 5 rejects such "common mode" signals efficiently, i.e. the corresponding CMRR is large. This can be seen by considering the loop action in response to the decrease of the p-drive voltage and the simultaneous increase of the n-drive voltage. Raising the n-drive voltage raises the voltage of node N6. This raises the base-emitter voltages Vbe of transistors Q7, Q8, and Q11. In turn, this opens up the transistors Q7, Q8, and Q11, increasing In. An increase of In is accompanied by an increase of the base currents of Q7, Q8, and Q11 as well, flowing through node N6.

The simultaneous decrease of the voltage of p-drive 11 increases Vbe for transistors Q5 and Q10, increasing the value of Ip. Once again, the increase of Ip is accompanied by a simultaneous increase of the base currents of Q5 and Q10, flowing through node N5. Since Q5 and Q10 are pnp transistors, here the base current is flowing out through node N5.

With the simultaneous increase of Ip and In, Iq is also increasing. Now, reference current generator 16 is forcing the unchanged reference current Iref to flow into node N4 and out of node N7. Applying Kirchhoff's law to node N4, the increase of outflowing current Iq and the constancy of inflowing current Iref requires that the current flowing from N4 to N6 decreases. However, a decrease of current flowing into N6 means that the base currents of Q7, Q8, and Q11 also decrease. This, in turn, suppresses In, in opposition to the original increase of In. An analogous reasoning for p-drive 11 shows that the response to the increase of Ip tends to decrease Ip.

In sum, the loop action response to a common mode signal is a negative feedback acting against this common mode signal. This negative feedback results in a high Common Mode Rejection Ratio for Common Mode Controlled Amplifier 5. Similar feedback loop action was described above for the setting of the quiescent point of output transistors Q10 and Q11.

Aspects of the present embodiments include that it performs its functions with a small number of components. Not counting standard circuitry elements, including reference current generator 16, current mirror 55, and buffers 41 and 44, Common Mode Controlled Amplifier 5 includes 11 transistors. In related embodiments the number of transistors are between about 10 and about 15.

Furthermore, mean current generator 27 is formed from only one type of transistors (in the present embodiment of the npn type). Circuits built from the same type transistors can have advantages both for manufacturing as well as for reducing interference between the transistors.

Additionally, the functions of the mean current generator, the feedback circuitry, and the gain stage are well separated in the present embodiment. Such separation allows for convenient, module type circuit development. For example, the present gain stage 21 can be conveniently exchanged with a gain stage of a different architecture without modifying the rest of the circuitry.

Furthermore, the present embodiment has a symmetric architecture, which allows both the sinking and the sourcing of the output current. Non-symmetric architectures often do not have the capability of both sinking and sourcing the output currents.

Further, buffers 41 and 44 separate output transistors Q10 and Q11 from the rest of the circuitry. This separation suppresses the effect of the Q10 and Q11 base currents on the operation of the transistors of translinear loop 56, thus protecting the harmonic mean relationship between In and Ip.

Among others, the output currents are limited by how much base current can be supplied to output transistors Q10 and Q11. Buffers 41 and 44 enhance the available base currents of Q10 and Q11, improving the maximum achievable output currents of the embodiments. From the input perspective, buffers 41 and 44 further enhance the input impedance of gain stage 21. In some embodiment buffers 41 and 44 enhance the input impedance by a beta factor.

Correspondingly, the open loop gain of amplifiers employing the embodiments, which characterizes the ratio of the output voltage to the differential input voltage, can be between about 70 dB and 110 dB, for example, about 85 dB.

Also, in applications, currents are flowing through the collectors of output transistors even when there is no load. This leads to unwanted power consumption. The collector currents of output transistors are considerably larger than the collector currents of the transistors of mean current generator 27 and feedback circuitry 31. As described, the ratio of collector currents is controlled by the factor n, which can be in the range of about one to about a hundred. Therefore, in circuitry, where the functions of mean current generator 27 and feedback circuitry 31 are not well separated from gain stage 21, large quiescent currents are flowing through several transistors, leading to a large power consumption. Thus, separating the circuitry of gain stage 21 from the rest of the circuitry, as done in the present embodiment, reduces the total power consumption.

The supply voltage of the present embodiment lies in the range of about 1.8V to about 12V. For example, 5V is a typical supply voltage in modem power supply applications. At a supply voltage of about 5V, embodiments of the invention can have linear output currents of about 50 mA to about 200 mA, for example, 100 mA, which represents a large output current capability.

As mentioned above, when the output transistors of the present push-pull gain stage are operated in saturation, the collector voltages can come within 60 mV of the rail voltage and the ground, respectively. This is a 0.4–0.5V gain per output transistor, resulting in a gain in voltage swing up to about 1V over non push-pull, non-saturated gain stages.

Also, as mentioned above, forcing a harmonic mean relationship between In and Ip ensures that output transistors Q10 and Q11 do not shut down. Therefore, embodiments substantially avoid the slow recovery of shut down output transistors and the corresponding dynamic and harmonic signal distortions. Therefore, embodiments can operate in a wide frequency range with low distortion. Examples include operating with a bandwidth of about 200 MHz. At present, a standard operating frequency of video circuitry is 3.5 MHz. Therefore, circuitry that operates at or above 3.5 MHz can be used in video circuitry. Correspondingly, embodiments can operate at frequencies of 10 MHz and higher.

Figure 5:
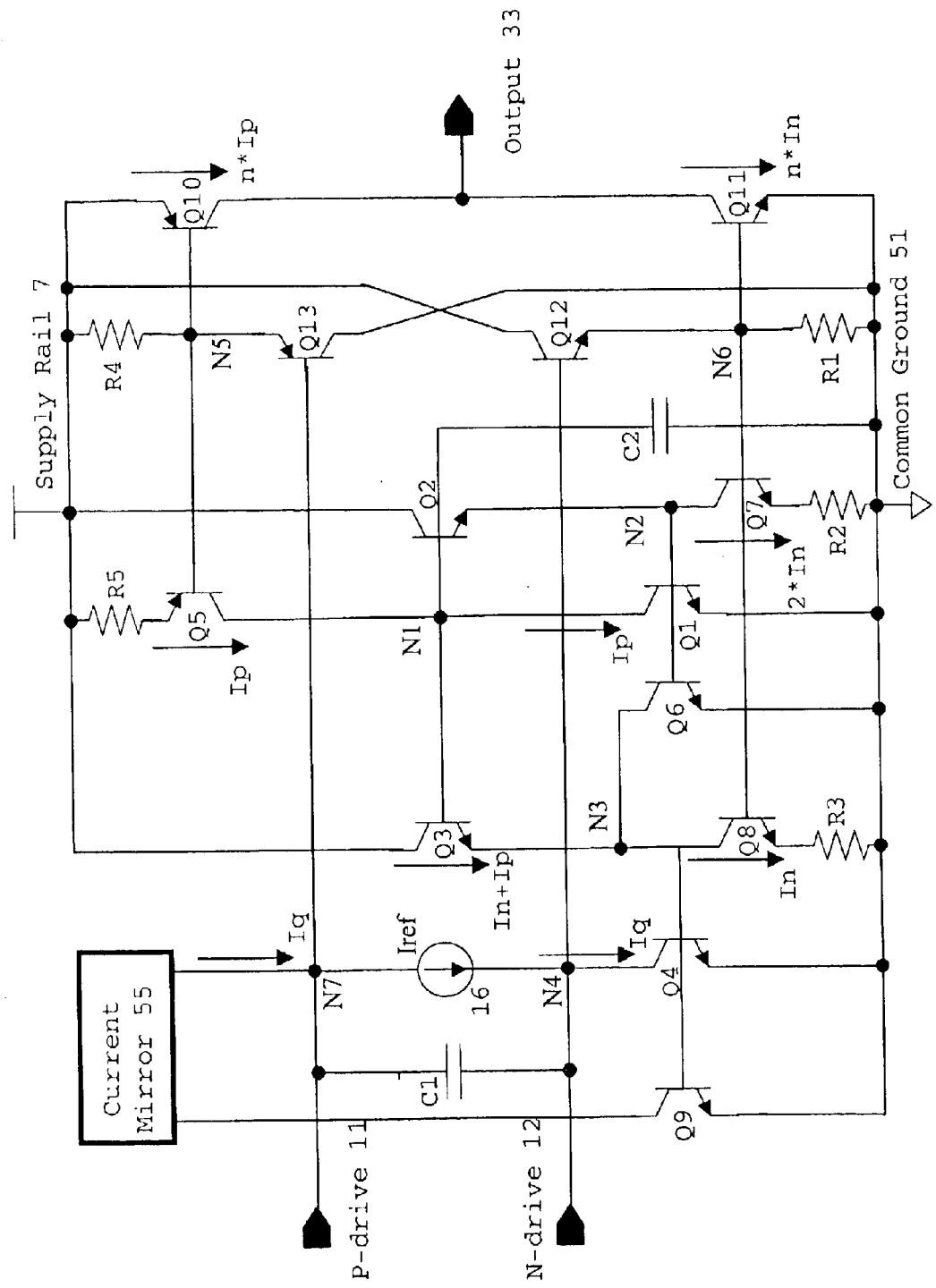
FIG. 5 is an exemplary implementation of a Common Mode Controlled Amplifier according to an embodiment of the invention.

FIG. 5 illustrates an embodiment. This embodiment shares many circuit elements with FIG. 4. Furthermore, it displays particular embodiments p-buffer 41 and n-buffer 44. P-buffer 41 includes pnp transistor Q13. The emitter of transistor Q13 is coupled to node N5, the base of Q13 is coupled to node N7, and the collector of Q13 is coupled to common ground 51. Further, p-buffer 41 also includes resistor R4, coupled between node N5 and supply rail 7. Correspondingly, n-buffer 44 includes npn transistor Q12. The collector of transistor Q12 is coupled to supply rail 7, the emitter of Q12 is coupled to node N6, and the base of Q12 is coupled to node N4. Further, n-buffer 44 includes resistor R1, coupled between node N6 and common ground 51. These buffer types are well known in the art. Other embodiments include other types of buffers.

In addition, the embodiment includes capacitors C1 and C2. Capacitor C1 is coupled between p-drive 11 and n-drive 12. Capacitor C2 is coupled between node N1 and common ground 51. Further, the embodiment includes resistors R2, R3, and R5. Resistor R2 is coupled between the emitter of transistor Q7 and common ground 51, resistor R3 is coupled between the emitter of transistor Q8 and common ground 51, and resistor R5 is coupled between the emitter of capacitor Q5 and supply rail 7.

The functions of capacitor C1 include compensation for the damping of the common mode feedback loop. The function of capacitor C2 includes compensation, in relation to transistors Q1 and Q2. The compensation is dependent on the speed of the transistors.

The functions of resistors R2, R3, and R5 include the compensation for the effects of the base currents, which were neglected in the analysis presented in relation to FIG. 3. In particular, R2, R3, and R5 create a non-linear relationship between the output current n*In and the feedback current In. At low output currents the relationship is approximately linear, at higher currents the deviation increases. At these higher output currents the feedback current does not grow linearly with the output current. This reduction of the feedback current reduces the effects of the neglected base currents of the translinear loop on the mean relationship.

Figure 6:
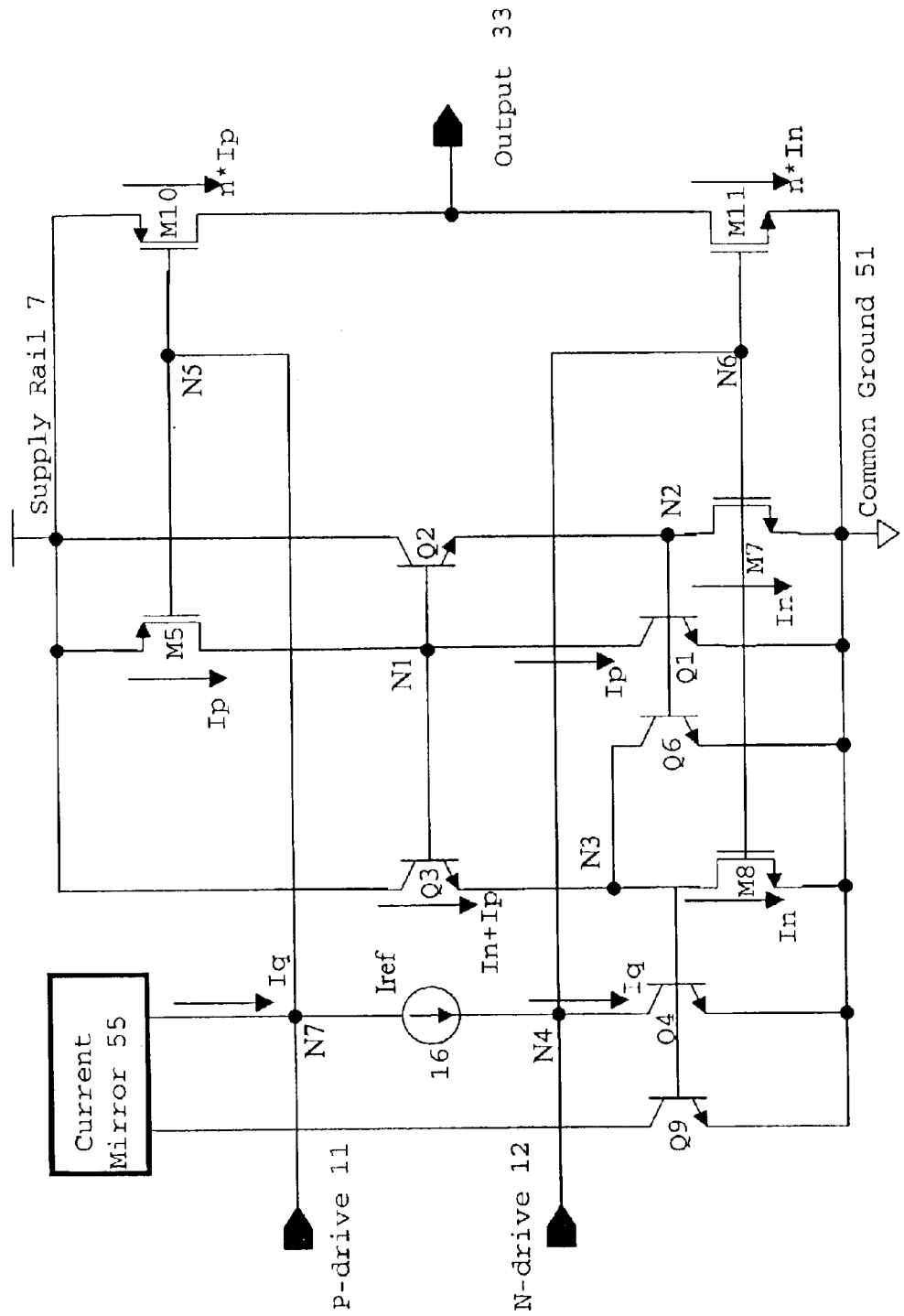
FIG. 6 is an exemplary implementation of a Common Mode Controlled Amplifier according to an embodiment of the invention, including CMOS transistors.

FIG. 6 illustrates another embodiment. This embodiment shares many circuit elements with FIG. 4. However, in this embodiment the output transistors are CMOS transistors, denoted by M10 and M11. The source of output transistor M10 is coupled to supply rail 7, the gate of M10 is coupled to node N5, and the drain of M10 is coupled to the output terminal 33. The source of output transistor M11 is coupled to common ground 51, the gate of M11 is coupled to node N6, and the drain is coupled to output terminal 33. Additionally, bipolar transistors Q5, Q7, and Q8 are replaced by CMOS transistors M5, M7, and M8. Accordingly, the source of M5 is coupled to supply rail 7, the drain of M5 is coupled to node N1, and the gate of M5 is coupled to node N5. The source of M7 is coupled to common ground 51, the drain of M7 is coupled to node N2, and the gate of M7 is coupled to node N6. The source of M8 is coupled to common ground 51, the drain of M8 is coupled to node N3, and the gate of M8 is coupled to node N6.

This embodiment includes CMOS transistor M7, so that M7 can be formed with an area n times smaller than M11. This architecture ensures that In, the source-drain current in M7 is substantially n times smaller than n*In, the source-drain current in M11, in analogy to the embodiment of FIG. 4. Similarly, M5 is formed as a CMOS transistor, so that Ip, the source-drain current of M5, is substantially n times smaller than n*Ip, the source-drain current of M10, in analogy to the embodiment of FIG. 4. Finally, M8 is formed as a CMOS transistor, because this architecture ensures that the source-drain current of M8 will be substantially the same as the source-drain current of M7, in analogy to the embodiment of FIG. 4.

Further, in the embodiment of FIG. 6 the circuit elements of gain stage 21 and the circuit elements of mean current generator 27 are well separated. Therefore, if design considerations require that the transistors of gain stage 21 are formed as CMOS transistors, the gain stage transistors can be changed from bipolar to CMOS transistors without affecting the design of mean current generator 27.

Figure 7:
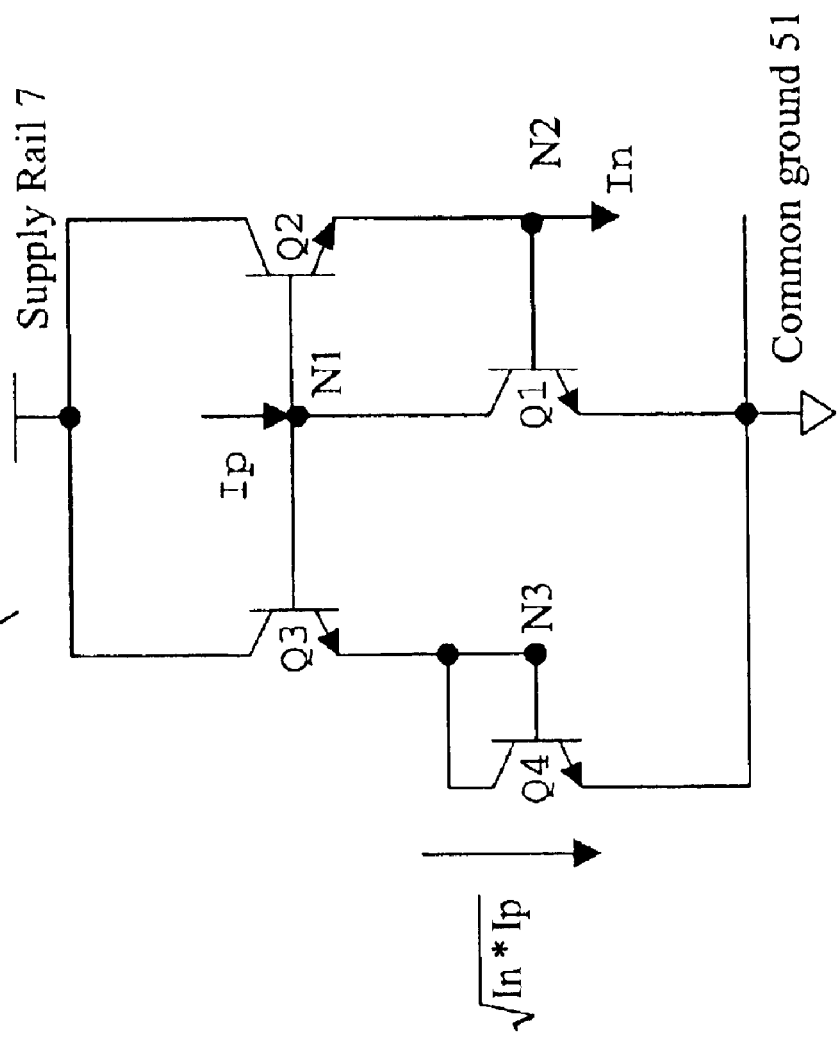
FIG. 7 is an exemplary implementation of a geometric mean current generator according to an embodiment of the invention.

FIG. 7 illustrates the operating principle of an embodiment of mean current generator 27. The present embodiment has four transistors, Q1, Q2, Q3, and Q4. In this embodiment the four transistors Q1–Q4 are all of the same type, for example bipolar npn transistors. Furthermore, Q1–Q4 have substantially same parameters, such as saturation current Is and beta factor. However, in other embodiments transistors can have different parameters. The collectors of transistors Q2 and Q3 are coupled to a supply rail 7. The emitter of transistor Q2 is coupled to an input node N2. The emitter of transistor Q3 is coupled to a node N3. The bases of Q2 and Q3 are coupled to an input node N1. The collector of transistor Q1 is also coupled to input node N1. The emitter of transistor Q1 is coupled to ground 51. The base of transistor Q1 is coupled to input node N2. The emitter of transistor Q4 is coupled to ground 51. The collector and the base of transistor Q4 are coupled to node N3.

The operation of the present embodiment can be understood from the following remarks. In the subsequent remarks the effect of base currents will be neglected. In related embodiments additional circuit elements are included to compensate for the effects of the base currents.

The supply rail provides a voltage Vcc. A current Ip is sourced into input node N1, generating a collector current Ip through transistor Q1. A current In is sunk from input node N2, generating a collector current In through transistor Q2. Finally, the collector currents of transistors Q3 and Q4 are substantially the same: Ic3=Ic4=Iq. The derivation below shows that in the present embodiment a collector current $$Iq=(In*Ip)^{1/2}$$

flows through transistor Q4. This particular combination is sometimes referred to as the "geometric mean" of In and Ip.

Using Kirchhoff's laws to express the voltage of input node N1 in two different ways one obtains:

$$Vbe1+Vbe2=Vbe3+Vbe4.$$

By the same arguments as were used in relation to FIG. 3, it can be seen that in the present embodiment again $$Ic1*Ic2=Ic3*Ic4$$

Now recalling that Ic1=Ip, Ic2=In, and Ic3=Ic4, one gets for Iq=Ic4:

$$Iq=(In*Ip)^{1/2},$$

the geometric mean, as described above.

Figure 8:
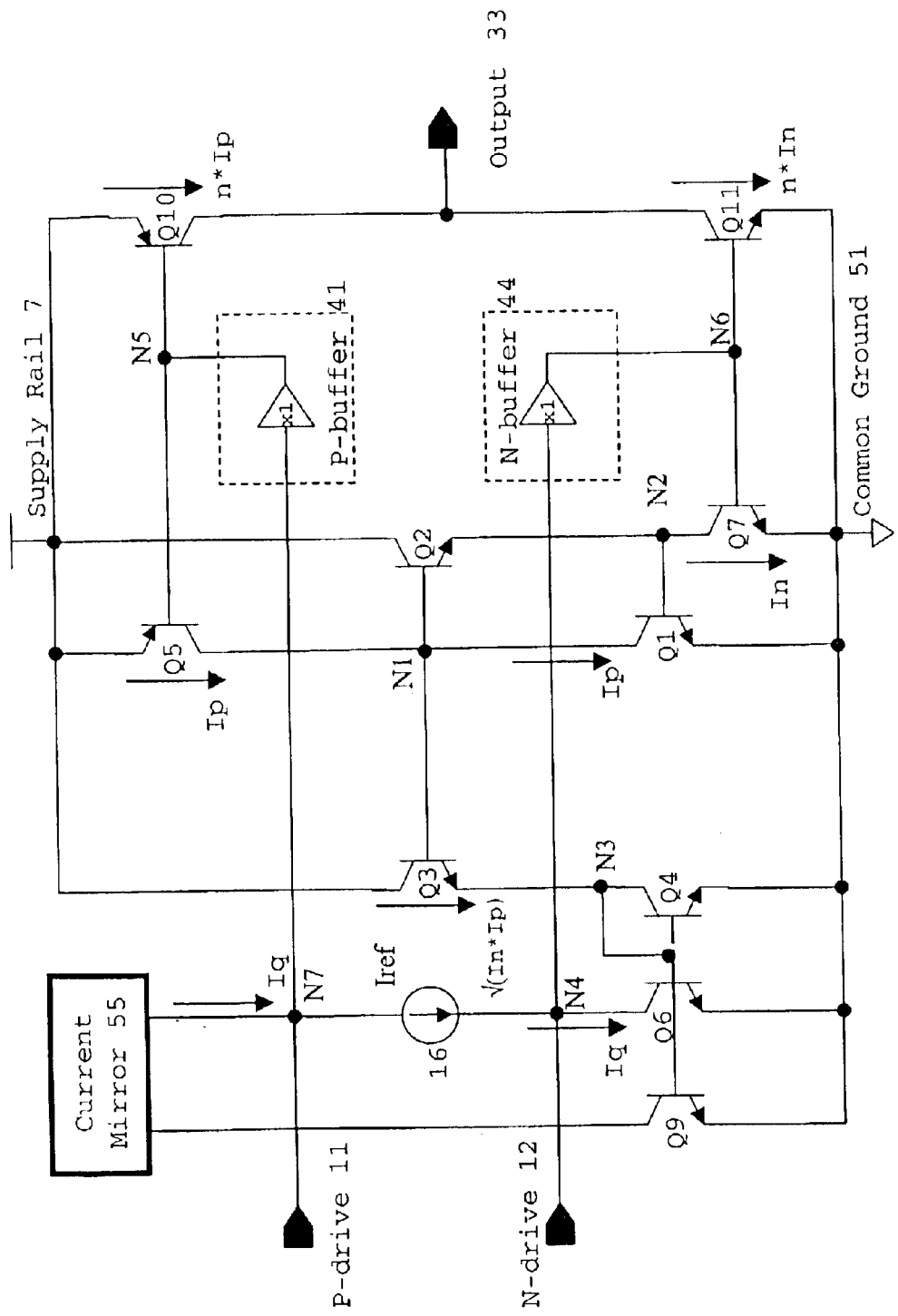
FIG. 8 is an exemplary implementation of a Common Mode Controlled Amplifier according to an embodiment of the invention.

FIG. 8 illustrates an embodiment, where the various functional units of FIG. 7 are shown in more detail. Similarly labeled transistors play similar functions in the different Figures. Transistors Q1–Q11 are npn type, with the exception of Q5 and Q10, which are pnp type. Other embodiments have the types of the transistors reversed.

In this embodiment mean current generator 27 includes transistors Q1–Q4, feedback circuit 31 includes transistors Q5–Q9, finally output stage 21 includes transistors Q10–Q11. Mean current generator 27 constitutes a translinear loop 56, which is biased by the current mode feedback of feedback circuit 31.

In FIG. 8 the collector of transistor Q1 is coupled to input node N1. The emitter of Q1 is coupled to common ground 51. The base of Q1 is coupled to input node N2. The collectors of transistors Q2 and Q3 are coupled to supply rail 7. The bases of Q2 and Q3 are coupled to input node N1. The emitter of Q2 is coupled to input node N2. The emitter of Q3 is coupled to node N3.

The collector of transistor Q4 is coupled to node N3. The base of Q4 is coupled the same node N3. The emitter of Q4 is coupled to ground 51. The emitter of pnp type transistor Q5 is coupled to supply rail 7, the base of Q5 is coupled to node N5, and the collector of Q5 is coupled to input node N1. The collector of transistor Q6 is coupled to node N4, the base of Q6 is coupled to the base of Q4, and the emitter of Q6 is coupled to ground 51. The collector of transistor Q7 is coupled to node N2, the base of Q7 is coupled to node N6, and the emitter of Q7 is coupled to ground 51. The collector of transistor Q9 is coupled to current mirror 55, the base of Q9 is coupled to the base of Q6, and the emitter of Q9 is coupled to ground 51. The emitter of pnp type output transistor Q10 is coupled to supply rail 7, the base of Q10 is coupled to node N5, and the collector of Q10 is coupled to output terminal 33. The collector of output transistor Q11 is coupled to output terminal 33. The base of Q11 is coupled to node N6, the emitter of Q11 is coupled to ground 51.

The architecture of the embodiment in FIG. 8 is symmetric for the p-signal, received through p-drive 11, and the n-signal, received through n-drive 12. Symmetric architectures typically have favorable dynamic performance, for example, the leading and trailing edges of impulses are symmetric, thus reducing a possible source of dynamic distortions and harmonic distortions.

P-drive 11 is coupled to node N7 and n-drive 12 is coupled to node N4. Reference current source 16 is coupled between nodes N7 and N4. P-buffer 41 is coupled between nodes N5 and N7, and n-buffer 44 is coupled between nodes N4 and N6.

The operation of the described circuit can be illustrated from the following remarks. Transistor Q5 serves as a current source, sourcing a current Ip into input node N1, thus generating a collector current Ip through transistor Q1. Transistor Q7 serves as a current source, sinking a current In from input node N2, thus generating a collector current In through transistor Q2.

The above remarks illustrate that mean current generator 27, which includes transistors Q1–Q4, has a current Ip sourced into input node N1, a current In sunk from input node N2, and collector currents Ic3 and Ic4 are substantially equal. As described in relation to FIG. 7, therefore a current Iq=(In*Ip)$^{1/2}$ will flow through the collector of transistor Q4. For this reason, in the present embodiment the geometric mean of currents In and Ip is generated in Q4 by mean current generator 27.

Mean current generator 27 and feedback circuit 31 are coupled to output stage 21. The base-emitter voltage of pnp transistor Q5 is the same as the base-emitter voltage of pnp output transistor Q10: Vbe5=Vbe10. Q10 is manufactured so that the junction area of Q10 is n times bigger than the junction area of Q5. Therefore, the same base-emitter voltage generates a collector current in Q10, which is n times bigger than the collector current of Q5: Ic10=n*Ip. In embodiments the value of n varies between about 1 to about a hundred, for example between about 10 to about 15.

Similarly, the junction area of npn output transistor Q11 is n times bigger than the junction area of transistor Q7, and the base-emitter voltages of these two transistors are the same as well. Therefore, Ic11=n*In.

By applying Kirchhoff's law at output terminal 33, the output current is determined as:

$$Iout=n*Ip-n*In.$$

The output voltage at output terminal 33 is controlled by an external feedback circuitry. Examples of this external feedback circuitry are well known in the art and will not be described in detail.

The output voltage can swing close to the supply voltage. The collector voltage of output transistor Q10 can swing as high as a diode drop, or approximately 0.6V below the voltage of supply rail 7 in non-saturated operations. When Q10 is saturated, then the collector voltage can swing even higher, for example only 0.2 V below the voltage of supply rail 7. Similarly, the collector voltage of output transistor Q11 can swing within 0.2V of ground in saturated operations. Amplifiers with such large voltage swing are sometimes referred to as "rail-to-rail" amplifiers.

Without a signal in p-drive 11 and n-drive 12, reference current generator 16 forces Iq to be equal to reference current Iref: Iq=Iref. Furthermore, the voltage of node N4 equals the voltage of node N6: VN4=VN6, and the voltage of node N5 equals the voltage of node N7: VN5=VN7. Reference current generator 16 adjusts the voltages VN5 and VN6 by adjusting VN7 and VN4, respectively, so that the base-emitter voltage Vbe7 of Q7 is consistent with a collector current of Ic7=In, and the base-emitter voltage Vbe5 of Q5 is consistent with a collector current of Ic5=Ip. Correspondingly, a current n*Ip will flow in Q10 and a current n*In in Q11.

In sum, mean current generator 27, controlled by feedback loop 31, controls the quiescent currents of output transistors Q10 and Q11.

The geometric relationship between In and Ip holds only approximately, as the circuit analysis neglected base currents. The output transistors Q10 and Q11 are typically bigger than the transistors Q1–Q9 of mean current generator 27 and feedback loop 31. Therefore, the base currents of Q10 and Q11 are bigger as well, potentially seriously modifying the geometric relationship between In and Ip. The buffers 41 and 44 are capable of preventing the large base currents of output transistors Q10 and Q11 to disadvantageously influence the currents of mean current generator 27 and feedback loop 31.

The small signal behavior of the circuit can be illustrated by the following remarks.

Typically a signal has a differential component and a common mode component. As demonstrated above, the output current of Common Mode Controlled Amplifier 5 is Iout=n*Ip−n*In, i.e. Iout is proportional to the difference of Ip and In. As described above, the voltage of p-drive 11 controls Ip and the voltage of n-drive 12 controls In. For reasons described in relation to FIG. 4, raising the voltage of p-drive 11 and n-drive 12 simultaneously is referred to as "differential signal", and varying them in an opposing symmetrical manner is called "common mode".

In biasing schemes, where Common Mode Controlled Amplifier 5 is used to source current at output terminal 33, Ip is chosen to be greater than In. In such embodiments, output current Iout=(n*IP−n*In) is decreases, when the "differential signal" is raised. In a completely analogous manner, when the "differential signal" is decreased, output current Iout=(n*Ip−n*In) increases.

The "common mode" of Common Mode Controlled Amplifier 5 includes raising the voltage of one drive and lowering the voltage of the other drive. Common Mode Controlled Amplifier 5 rejects such "common mode" signals efficiently, i.e. the corresponding CMRR is large. This can be seen by considering the loop action in response to the decrease of the p-drive voltage and the simultaneous increase of the n-drive voltage. Raising the n-drive voltage raises the voltage of node N6. This raises the base-emitter voltages Vbe of transistors Q7 and Q11. In turn, this opens up the transistors Q7 and Q11, increasing In. An increase of In is accompanied by an increase of the base currents of Q7 and Q1 as well, flowing through node N6.

The simultaneous decrease of the voltage of p-drive 11 increases Vbe for transistors Q5 and Q10, increasing the value of Ip. Once again, the increase of Ip is accompanied by a simultaneous increase of the base currents of Q5 and Q10, flowing through node N5. Since Q5 and Q10 are pnp transistors, here the base current is flowing out through node N5.

Further, Q6 acts as a current mirror for Q4, as their base-emitter voltages are the same: Vbe4=Vbe6. Therefore, the collector current of Q6 substantially equals the collector current of Q4, Ic6=Ic4=Iq.

With the simultaneous increase of Ip and In, Iq is also increasing, Iq being the geometric mean of In and Ip. Now, reference current generator 16 is forcing the unchanged reference current Iref to flow into node N4 and out of node N7. Applying Kirchhoff's law to node N4, the increase of outflowing current Iq and the constancy of inflowing current Iref requires that the current flowing from N4 to N6 decreases. However, a decrease of current flowing into N6 means that the base currents of Q7 and Q11 also decrease. This, in turn, suppresses In, in opposition to the original increase of In. An analogous reasoning for p-drive 11 shows that the response to the increase of Ip tends to decrease Ip.

In sum, the loop action response to a common mode signal is a negative feedback acting against this common mode signal. This negative feedback results in a high Common Mode Rejection Ratio for Common Mode Controlled Amplifier 5. Similar feedback loop action was described above for the setting of the quiescent point of output transistors Q10 and Q11.

Aspects of the present embodiments include that it performs its functions with a small number of components. Not counting standard circuitry elements, including reference current generator 16, current mirror 55, and buffers 41 and 44, Common Mode Controlled Amplifier 5 includes 10 transistors. In related embodiments the number of transistors are between about 10 and about 15.

Furthermore, mean current generator 27 is formed from only one type of transistors (in the present embodiment of the npn type). Circuits built from the same type transistors can have advantages both for manufacturing as well as for reducing interference between the transistors.

Additionally, the functions of the mean current generator, the feedback circuitry, and the gain stage are well separated in the present embodiment. Such separation allows for convenient, module type circuit development. For example, the present gain stage 21 can be conveniently exchanged with a gain stage of a different architecture without modifying the rest of the circuitry.

Furthermore, the present embodiment has a symmetric architecture, which allows both the sinking and the sourcing of the output current. Non-symmetric architectures often do not have the capability of both sinking and sourcing the output currents.

Further, buffers 41 and 44 separate output transistors Q10 and Q11 from the rest of the circuitry. This separation suppresses the effect of the Q10 and Q11 base currents on the operation of the transistors of translinear loop 56, thus protecting the geometric mean relationship between In and Ip.

Among others, the output currents are limited by how much base current can be supplied to output transistors Q10 and Q11. Buffers 41 and 44 enhance the available base currents of Q10 and Q11, improving the maximum achievable output currents of the embodiments. From the input perspective, buffers 41 and 44 further enhance the input impedance of gain stage 21. In some embodiment buffers 41 and 44 enhance the input impedance by a beta factor.

Correspondingly, the open loop gain of amplifiers employing the embodiments, which characterizes the ratio of the output voltage to the differential input voltage, can be between about 70 dB and 110 dB, for example, about 85 dB.

Also, in applications, currents are flowing through the collectors of output transistors even when there is no load. This leads to unwanted power consumption. The collector currents of output transistors are considerably larger than the collector currents of the transistors of mean current generator 27 and feedback circuitry 31. As described, the ratio of collector currents is controlled by the factor n, which can be in the range of about one to about a hundred. Therefore, in circuitry, where the functions of mean current generator 27 and feedback circuitry 31 are not well separated from gain stage 21, large quiescent currents are flowing through several transistors, leading to a large power consumption. Thus, separating the circuitry of gain stage 21 from the rest of the circuitry, as done in the present embodiment, reduces the total power consumption.

The supply voltage of the present embodiment lies in the range of about 1.8V to about 12V. For example, 5V is a typical supply voltage in modern power supply applications. At a supply voltage of about 5V, embodiments of the invention can have linear output currents of about 50 mA to about 200 mA, for example, 100 mA, which represents a large output current capability.

As mentioned above, when the output transistors of the present push-pull gain stage are operated in saturation, the collector voltages can come within 60 mV of the rail voltage and the ground, respectively. This is a 0.4–0.5V gain per output transistor, resulting in a gain in voltage swing up to about 1V over non push-pull, non-saturated gain stages.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. An output circuit, comprising:
   a gain stage, having output transistors;
   an n drive and a p drive, the drives coupled to the gain stage;
   a mean current generator, coupled to the drives, wherein
     the mean current generator comprises current nodes, wherein currents can be provided at the current nodes, wherein providing a current comprises one of sinking a current and supplying a current; and
     the mean current generator is operable to generate a current with a value substantially equal to the harmonic mean of currents, provided at two current nodes;
   a reference current generator, coupled to the mean current generator; and
   feedback circuitry, coupled between the gain stage and the mean current generator, wherein
     the feedback, provided by the feedback circuitry to the mean current generator, is a current mode feedback, controlling the quiescent current of the output transistors of the gain stage.

2. The output circuit of claim 1, wherein the mean current generator comprises:
   a first transistor, having an emitter, a collector and a base, the collector coupled to a first current node, the emitter coupled to a ground, and the base coupled to a second current node;
   a second transistor, having an emitter, a collector and a base, the collector coupled to a supply rail, the emitter coupled to the second current node, and the base coupled to the first current node;
   a third transistor, having an emitter, a collector and a base, the collector coupled to a supply rail, the emitter coupled to a third current node, and the base coupled to the first current node; and
   a fourth transistor, having an emitter, a collector and a base, the collector coupled to a supply rail, the emitter coupled to the ground, and the base coupled to the third current node.

3. The output circuit of claim 2, wherein the mean current generator is operable to generate a collector current in the fourth transistor, with a value substantially equal to the harmonic mean of a current provided at the first current node and a current provided at the second current node.

4. The output circuit of claim 1, wherein the mean current generator is formed from only one of pnp, npn, pmos, and nmos type transistors.

5. The output circuit of claim 1, wherein the number of transistors with high collector current during no-load operation is not more than two.

6. The output circuit of claim 1, wherein the architecture of the output circuit is symmetric for the p-drive and the n-drive.

7. The output circuit of claim 1, wherein the architecture for driving the output stage is non-symmetric.

8. The output circuit of claim 1, wherein the output voltage of the gain stage can have rail to rail swings.

9. The output circuit of claim 8, wherein the output voltage of the gain stage can assume values within 50 mV to a supply voltage.

10. The output circuitry of claim 1, wherein
    the feedback circuitry is operable to compute the difference of a reference current, provided by the reference current generator, and the mean current, generated by the mean current generator.

11. An output circuit, comprising:
    a gain stage, having output transistors;
    an n drive and a p drive, the drives coupled to the gain stage;
    a mean current generator, coupled to the drives, wherein
      the mean current generator comprises current nodes, wherein currents can be provided at the current nodes, wherein providing a current comprises one of sinking a current and supplying a current; and
      the mean current generator generates a current with a value substantially equal to the geometric mean of currents, provided at two current nodes;
    a reference current generator, coupled to the mean current generator; and
    feedback circuitry, coupled between the gain stage and the mean current generator, wherein
      the feedback, provided by the feedback circuitry to the mean current generator, is a current mode feedback, controlling the quiescent current of the output transistors of the gain stage.

12. The output circuit of claim 11, wherein the mean current generator is formed from same species of transistors.

13. The output circuit of claim 11, wherein the mean current generator is formed from only one of pnp, npn, pmos, and nmos type transistors.

14. The output circuit of claim 11, wherein the output transistors of the gain stage comprise:
a fifth transistor, having a collector, an emitter and a base, the emitter coupled to the supply rail, the base coupled to the p-drive and the collector to an output terminal; and
a sixth transistor, having a collector, an emitter and a base, the emitter coupled to the ground, the base coupled to the n-drive and the collector to the output terminal, wherein
the gain stage operates as a class AB stage.

15. The output circuit of claim 11, wherein the output transistors of the gain stage is formed from one of bipolar and CMOS transistors.

16. The output circuit of claim 11, wherein the mean current generator, the feedback circuit, and the gain stage are formed from separate circuit elements.

17. The output circuit of claim 11, wherein the number of transistors with high collector current during no-load operation is not more than two.

18. The output circuit of claim 11, wherein the gain stage is separated from the drives by buffers.

19. The output circuit of claim 11, wherein the number of transistors is not more than fifteen.

20. The output circuit of claim 11, wherein the architecture of the output circuit is symmetric for the p-drive and the n-drive.

21. The output circuit of claim 11, wherein the architecture for driving the output stage is non-symmetric.

22. The output circuit of claim 11, wherein the output voltage of the gain stage can have rail to rail swings.

23. The output circuit of claim 22, wherein the output voltage of the gain stage can assume values within 50 mV to a supply voltage.

24. The output circuit of claim 11, wherein the output circuit is operable with a frequency greater than 10 MHz.

25. The output circuitry of claim 11, wherein
the feedback circuitry is operable to compute the difference of a reference current, provided by the reference current generator, and the mean current, generated by the mean current generator.

26. The output circuit of claim 11, wherein the mean current generator comprises:
a first transistor, having an emitter, a collector and a base, the collector coupled to a first current node, the emitter coupled to a ground, and the base coupled to a second current node;
a second transistor, having an emitter, a collector and a base, the collector coupled to a supply rail, the emitter coupled to the second current node, and the base coupled to the first current node;
a third transistor, having an emitter, a collector and a base, the collector coupled to a supply rail, the emitter coupled to a third current node, and the base coupled to the first current node; and
a fourth transistor, having an emitter, a collector and a base, the collector coupled to the third current node, the emitter coupled to the ground, and the base coupled to the third current node.

27. The output circuit of claim 26, wherein the mean current generator is operable to generate a collector current in the fourth transistor, with a value substantially equal to the geometric mean of a current provided at the first current node and a current provided at the second current node.

28. A method of operating an output circuit, wherein the output circuit comprises:
a gain stage, having output transistors;
an n drive and a p drive, the drives coupled to the gain stage;
a mean current generator, comprising current nodes, the mean current generator coupled to the drives;
a reference current generator, coupled to the mean current generator; and
a feedback circuitry, coupled between the gain stage and the mean current generator, wherein the method comprises:
providing currents at the current nodes, wherein providing a current comprises one of sinking a current and supplying a current;
generating a mean of provided currents with the mean current generator; and
providing a current mode feedback by the feedback circuitry to the mean current generator for controlling the quiescent current of the output transistors of the gain stage, wherein generating a mean comprises
generating one of a harmonic mean and a geometric mean.

29. The method of claim 28, wherein the gain stage comprises output transistors, wherein the method comprises
operating the gain stage without shutting down the output transistors.

30. The method of claim 28, wherein the providing a feedback comprises
computing the difference current of the mean current, generated by the mean current generator, and the reference current, generated by the reference current generator; and
using the computed difference current for feedback by the feedback circuitry.

* * * * *